(12) United States Patent
Kim

(10) Patent No.: US 9,218,910 B2
(45) Date of Patent: Dec. 22, 2015

(54) MULTILAYER CERAMIC CAPACITOR, MANUFACTURING METHOD OF THE SAME, AND CIRCUIT BOARD WITH MULTILAYER CERAMIC CAPACITOR MOUNTED THEREON

(71) Applicant: SAMSUNG ELECTRO-MECHANICS CO., LTD., Suwon, Gyunggi-do (KR)

(72) Inventor: Jun Hee Kim, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 135 days.

(21) Appl. No.: 13/781,411

(22) Filed: Feb. 28, 2013

(65) Prior Publication Data

US 2014/0177129 A1    Jun. 26, 2014

(30) Foreign Application Priority Data

Dec. 21, 2012    (KR) ........................ 10-2012-0151019

(51) Int. Cl.
| | |
|---|---|
| *H01G 4/35* | (2006.01) |
| *H01G 4/30* | (2006.01) |
| *H01G 4/008* | (2006.01) |
| *H01G 4/012* | (2006.01) |
| *H01G 4/232* | (2006.01) |
| *H05K 3/34* | (2006.01) |

(52) U.S. Cl.
CPC ............... *H01G 4/35* (2013.01); *H01G 4/0085* (2013.01); *H01G 4/012* (2013.01); *H01G 4/232* (2013.01); *H01G 4/30* (2013.01); *H05K 3/3442* (2013.01); *H05K 2201/10636* (2013.01)

(58) Field of Classification Search
CPC ..... H01G 4/012; H01G 4/0085; H01G 4/232; H01G 4/30
USPC .................................. 361/306.3, 321.2, 301.4
See application file for complete search history.

(56) References Cited

U.S. PATENT DOCUMENTS

| | | | | |
|---|---|---|---|---|
| 5,144,527 | A * | 9/1992 | Amano et al. | ............. 361/321.2 |
| 7,495,885 | B2 * | 2/2009 | Togashi et al. | ............. 361/306.3 |
| 2002/0007908 | A1 * | 1/2002 | Mamada | ........................ 156/293 |
| 2008/0304204 | A1 * | 12/2008 | Suzuki | ........................ 361/321.3 |
| 2010/0206624 | A1 * | 8/2010 | Feichtinger | ................... 174/260 |

FOREIGN PATENT DOCUMENTS

| | | | | |
|---|---|---|---|---|
| JP | | 02208913 | A * | 8/1990 |
| JP | | 08279436 | A * | 10/1996 |

(Continued)

*Primary Examiner* — David M Sinclair
(74) *Attorney, Agent, or Firm* — McDermott Will & Emery LLP

(57) ABSTRACT

There is provided a multilayer ceramic capacitor including: a ceramic body including a dielectric layer; a first internal electrode having a first non-pattern portion and a first pattern portion having one end exposed to one or more of surfaces of the ceramic body; a second internal electrode having an overlap region with the first pattern portion with the dielectric layer interposed therebetween and having a second non-pattern portion and a second pattern portion having one end exposed to one or more of surfaces of the ceramic body; and first and second external electrodes electrically connected to the first and second internal electrodes, respectively, wherein the first and second pattern portions have a metal oxide region having a predetermined width from an exposed end portion of a region thereof not connected to the first or the second external electrode, among exposed end portions, toward a central portion thereof, respectively.

10 Claims, 9 Drawing Sheets

(56) References Cited

FOREIGN PATENT DOCUMENTS

| JP | 10-289837 | A |   | 10/1998 |
| JP | 11-340089 | A |   | 12/1999 |
| JP | 2002015939 | A | * | 1/2002 |
| JP | 2005259772 | A | * | 9/2005 |
| JP | 2009054973 | A | * | 3/2009 |

* cited by examiner

MULTILAYER CERAMIC CAPACITOR, MANUFACTURING METHOD OF THE SAME, AND CIRCUIT BOARD WITH MULTILAYER CERAMIC CAPACITOR MOUNTED THEREON

CROSS-REFERENCE TO RELATED APPLICATIONS

This application claims the priority of Korean Patent Application No. 10-2012-0151019 filed on Dec. 21, 2012, in the Korean Intellectual Property Office, the disclosure of which is incorporated herein by reference.

BACKGROUND OF THE INVENTION

1. Field of the Invention

The present invention relates to a multilayer ceramic capacitor, a manufacturing method of the same, and a circuit board allowing a multilayer ceramic capacitor to be mounted thereon.

2. Description of the Related Art

In general, electronic components using a ceramic material such as capacitors, inductors, piezoelectric elements, varistors, thermistors, and the like, include a ceramic body made of a ceramic material, internal electrodes formed within the ceramic body, and external electrodes installed on surfaces of the ceramic body such that they are connected to the internal electrodes.

Among ceramic electronic components, multilayer ceramic capacitors (MLCCs) include a plurality of laminated dielectric layers, internal electrodes disposed to face each other with a dielectric layer interposed therebetween, and external electrodes electrically connected to the internal electrodes.

MLCCs are commonly used as components in mobile communications devices such as portable computers, personal digital assistants (PDAs), mobile phones, and the like, due to inherent advantages thereof, such as compactness, guaranteed high capacitance, and ease of mountability.

Recently, as electronic products have been reduced in size and have had multifunctionality implemented therein, chip components have also become compact and highly functional, and consequently, multilayer ceramic capacitors which are small but have a high capacity are in demand.

Also, an MLCC disposed within a power circuit may be advantageously used as a bypass capacitor in a large scale integrated circuit (LSI), and in order for an MLCC to serve as a bypass capacitor therein, the MLCC is required to be able to effectively cancel high frequency noise. Such a requirement is increasing as electronic devices increasingly use high frequencies. An MLCC used as a bypass capacitor is electrically connected to a mounting pad of a circuit board through soldering and the mounting pad may be connected to a further external circuit through a wiring pattern or a conductive via.

An MLCC has equivalent series resistance (ESR) and equivalent series inductance (ESL) components, in addition to a capacitance component, and the ESR and ESL components may reduce a function of the bypass capacitor. In particular, ESL increases inductance in the capacitor at low frequencies to dampen high frequency noise canceling characteristics.

RELATED ART DOCUMENT (Patent document 1) Japanese Patent Laid Open Publication No. 1998-289837

SUMMARY OF THE INVENTION

An aspect of the present invention provides a multilayer ceramic capacitor having excellent capacitance and excellent mounting density, a method of manufacturing the same, and a circuit board with a multilayer ceramic capacitor mounted thereon.

According to an aspect of the present invention, there is provided a multilayer ceramic capacitor including: a ceramic body including a dielectric layer and having first and second main surfaces opposing one another, first and second lateral surfaces opposing one another, and first and second end surfaces opposing one another; a first internal electrode having a first non-pattern portion and a first pattern portion having one end exposed to one or more of the first and second lateral surfaces and the first and second end surfaces; a second internal electrode having an overlap region with the first pattern portion with the dielectric layer interposed therebetween and having a second non-pattern portion and a second pattern portion having one end exposed to one or more of the first and second lateral surfaces and the first and second end surfaces; and first and second external electrodes electrically connected to the first and second internal electrodes, respectively, wherein the first and second pattern portions have a metal oxide region having a predetermined width from an exposed end portion of a region thereof not connected to the first or the second external electrode, among exposed end portions, toward a central portion thereof, respectively.

When a width of the metal oxide region is 'd', the MLCC may satisfy $1\ \mu m \leq d \leq 20\ \mu m$.

The metal oxide region may be formed by oxidizing metal included in the first and second internal electrodes.

The first and second pattern portions may be exposed to the first and second lateral surfaces and the first and second end surfaces.

The first and second pattern portions may be exposed to the first and second lateral surfaces.

The first and second pattern portions may be exposed to the first and second end surfaces and the first lateral surface.

The first non-pattern portion may be formed in a first corner portion of the ceramic body, and the second non-pattern portion may be formed in a second corner portion opposite to the first corner portion in a length direction.

The first and second external electrodes may be formed on the first lateral surface.

The first and second external electrodes may extend from the first lateral surface to the first main surface.

The first and second external electrodes may extend from the first lateral surface to the first and second main surfaces.

The first and second external electrodes may extend from the first lateral surface to any one of the first and second main surfaces and the second lateral surface.

The first and second external electrodes may extend from the first lateral surface to the first and second main surfaces and the second lateral surface.

The first and second external electrodes may extend from the first lateral surface to a predetermined height on the first and second main surfaces.

The first and second external electrodes may have a band-like shape, and when a width of a region of the first and second external electrodes in contact with the first or second non-pattern portion is BW and a length of the first or second non-pattern portion is 'a', BW<a may be satisfied.

According to another aspect of the present invention, there is provided a method of manufacturing a multilayer ceramic capacitor, including: preparing a plurality of first and second ceramic green sheets; forming a first internal electrode on the first ceramic green sheet, the first internal electrode including a first pattern portion and a first non-pattern portion and the first pattern portion being exposed to an end surface of the first ceramic green sheet; forming a second internal electrode on the second ceramic green sheet, the second internal electrode including a second non-pattern portion and a second pattern portion having an overlap region with the first pattern portion and the second pattern portion being exposed to an end surface of the second ceramic green sheet; alternately laminating the first and second ceramic green sheets and firing the same to fabricate a ceramic body in which end portions of the first and second pattern portions are exposed to one or more of the first and second lateral surfaces and the first and second end surfaces; applying a resin to an outer surface of the ceramic body on which external electrodes are to be formed, to seal exposed end portions of the first and second pattern portions to be connected to the external electrodes; oxidizing an unsealed region of the end portions of the first and second pattern portions exposed to the outer surface of the ceramic body to form metal oxide regions; and removing the resin and subsequently forming first and second external electrodes electrically connected to the first and second internal electrodes, respectively.

The first non-pattern portion may be formed in a first corner portion of the ceramic body, and the second non-pattern portion may be formed in a second corner portion opposite to the first corner portion in a length direction.

The metal oxide region may have a predetermined width from an exposed end portion of a region of the first and second pattern portion not connected to the first or the second external electrode toward the interior of the first and second pattern portions.

When a width of the metal oxide region is 'd', $1\ \mu m \le d \le 20\ \mu m$ may be satisfied.

According to another aspect of the present invention, there is provided a method of manufacturing a multilayer ceramic capacitor, including: preparing a plurality of first and second ceramic green sheets; forming a first internal electrode on the first ceramic green sheet, the first internal electrode including a first pattern portion and a first non-pattern portion and the first pattern portion being exposed to an end surface of the first ceramic green sheet; forming a second internal electrode on the second ceramic green sheet, the second internal electrode including a second non-pattern portion and a second pattern portion having an overlap region with the first pattern portion and the second pattern portion being exposed to an end surface of the second ceramic green sheet; alternately laminating the first and second ceramic green sheets and firing the same to fabricate a ceramic body in which end portions of the first and second pattern portions are exposed to one or more of the first and second lateral surfaces and the first and second end surfaces; forming first and second external electrodes connected to the first and second internal electrodes, respectively; and oxidizing regions, which are not connected to the external electrodes, of the end portions of the first and second pattern portions exposed to the outer surface of the ceramic body, to form metal oxide regions, wherein the first and second external electrodes are made of a conductive resin composition.

The forming of the metal oxide region may be performed under an air atmosphere.

The conductive resin composition may include a metal powder not oxidized under an air atmosphere.

The metal powder may include silver (Ag).

The conductive resin composition may include an epoxy resin.

The first non-pattern portion may be formed in a first corner portion of the ceramic body, and the second non-pattern portion may be formed in a second corner portion opposite to the first corner portion in a length direction.

The metal oxide region may have a predetermined width from an exposed end portion of a region of the first and second pattern portion not connected to the first or the second external electrode toward the interior of the first and second pattern portions.

When a width of the metal oxide region is 'd', $1\ \mu m \le d \le 20\ \mu m$ may be satisfied.

According to another aspect of the present invention, there is provided a circuit board with a multilayer ceramic capacitor mounted thereon, including: a printed circuit board having first and second electrode pads formed on an upper portion thereof; and a multilayer ceramic capacitor mounted on the printed circuit board, wherein the multilayer ceramic capacitor includes: a ceramic body having first and second main surfaces opposing one another, first and second lateral surfaces opposing one another, and first and second end surfaces opposing one another; a first internal electrode having a first pattern portion exposed to one or more of the first and second lateral surfaces and the first and second end surfaces and a first non-pattern portion formed in a first corner portion of the ceramic body; a second internal electrode having a region overlapped with the first pattern portion with the dielectric layer interposed therebetween, the overlap region having a second pattern portion exposed to one or more of the first and second lateral surfaces and the first and second end surfaces and a second non-pattern portion formed in a second corner portion; and first and second external electrodes connected to the first and second internal electrodes, respectively, wherein the first and second pattern portions have a metal oxide region having a predetermined width from an exposed end portion of a region thereof not connected to the first or the second external electrode, among exposed regions, toward a central portion thereof, respectively.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
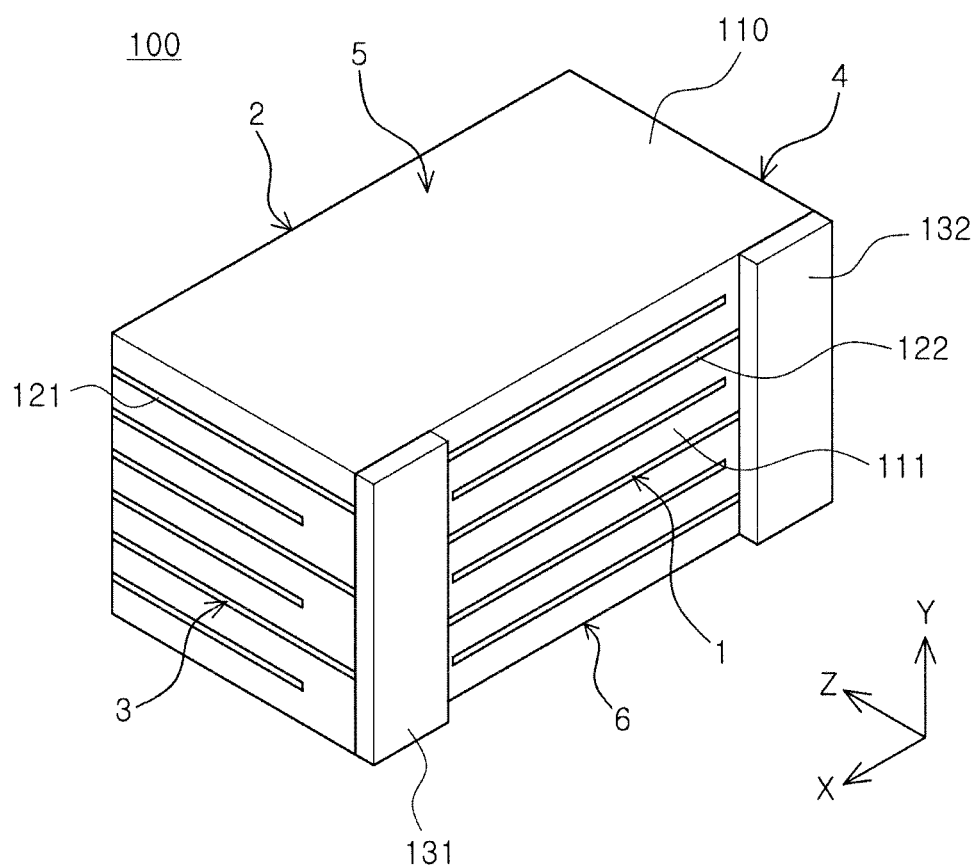
FIG. 1 is a schematic perspective view of a multilayer ceramic capacitor (MLCC) according to an embodiment of the present invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

Multilayer Ceramic Capacitor

FIG. 1 is a schematic perspective view of a multilayer ceramic capacitor (MLCC) according to an embodiment of the present invention.

Figure 2:
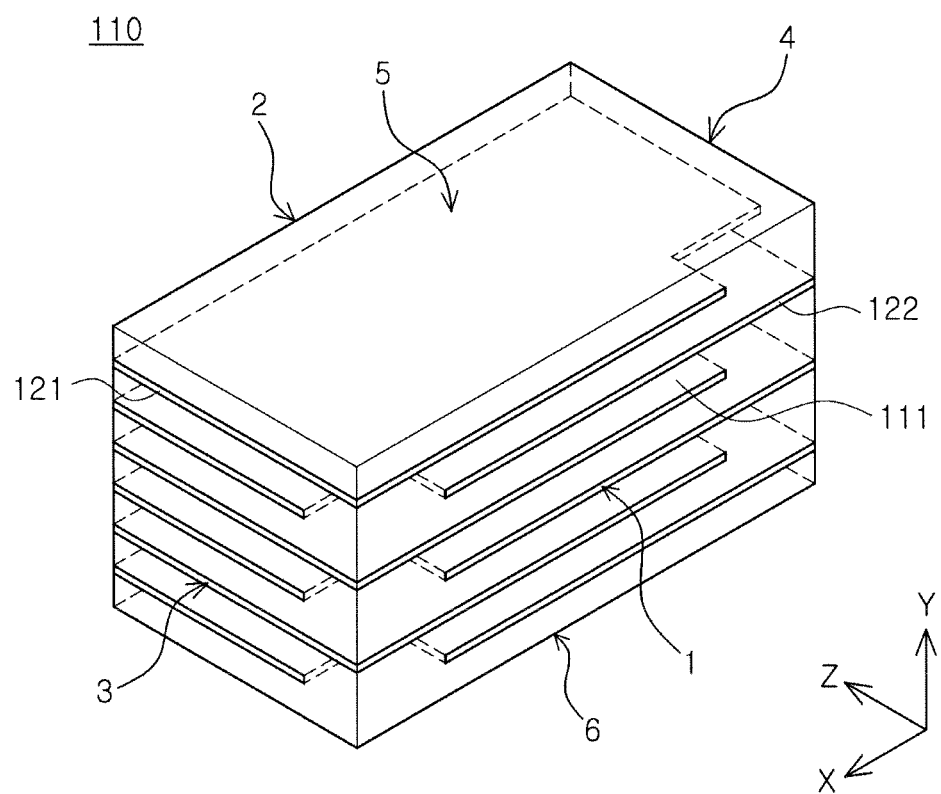
FIG. 2 is a schematic perspective view of a ceramic body of the MLCC according to an embodiment of the present invention.

FIG. 2 is a schematic perspective view of a ceramic body of the MLCC according to an embodiment of the present invention.

Figure 3:
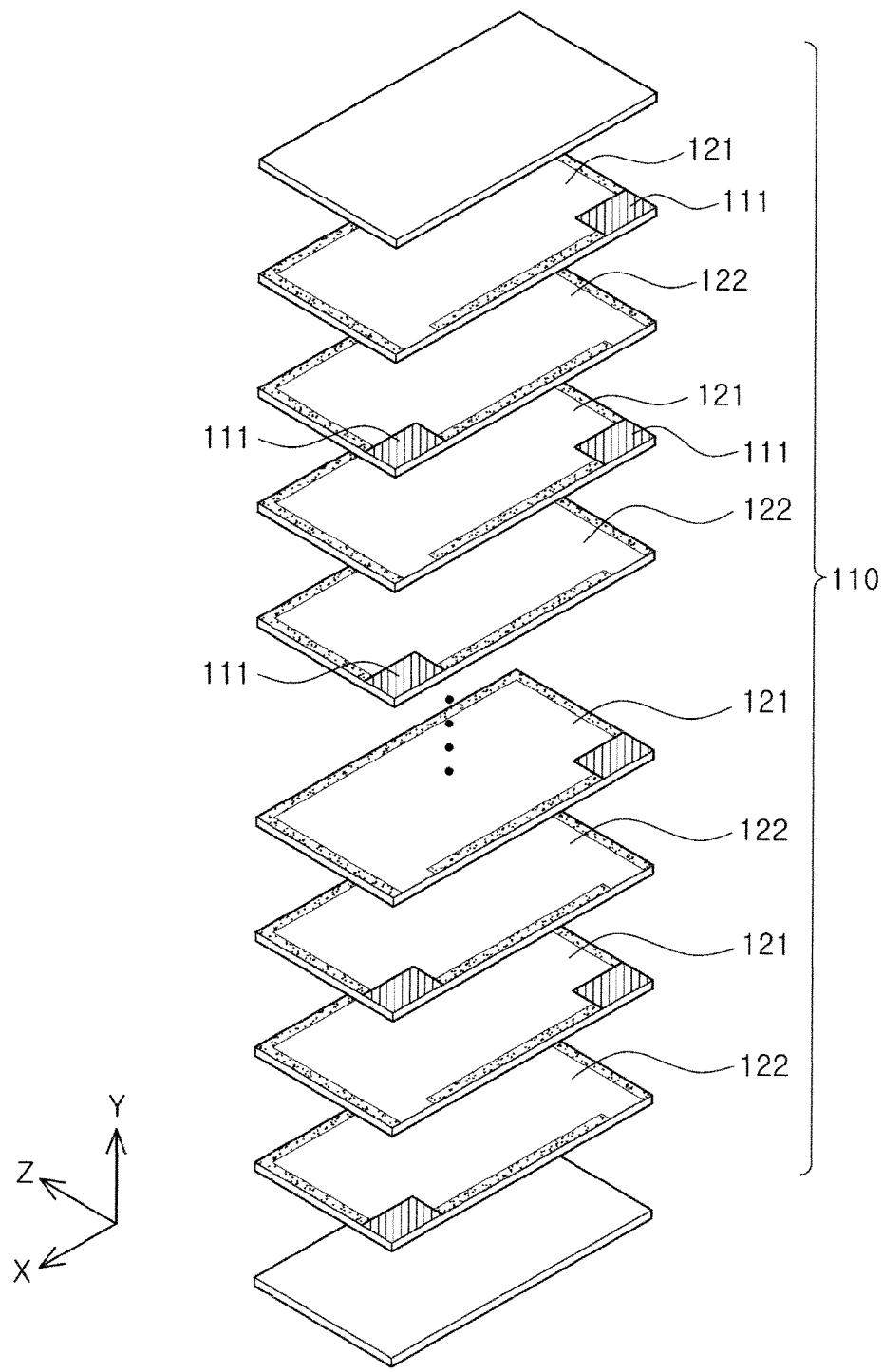
FIG. 3 is an exploded perspective view of the ceramic body of the MLCC according to an embodiment of the present invention.

FIG. 3 is an exploded perspective view of the ceramic body of the MLCC according to an embodiment of the present invention.

Figure 4A:
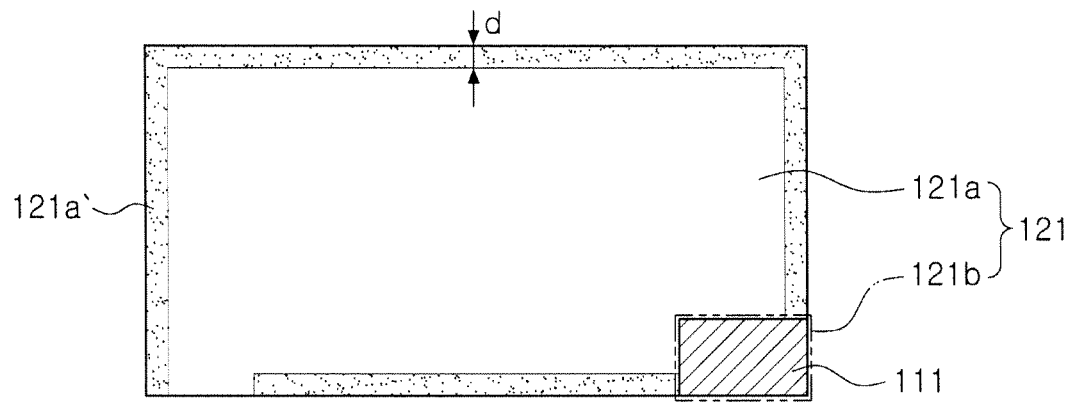
FIGS. 4A and 4B are plan views showing internal electrode structures of the MLCC according to an embodiment of the present invention.
Figure 4B:
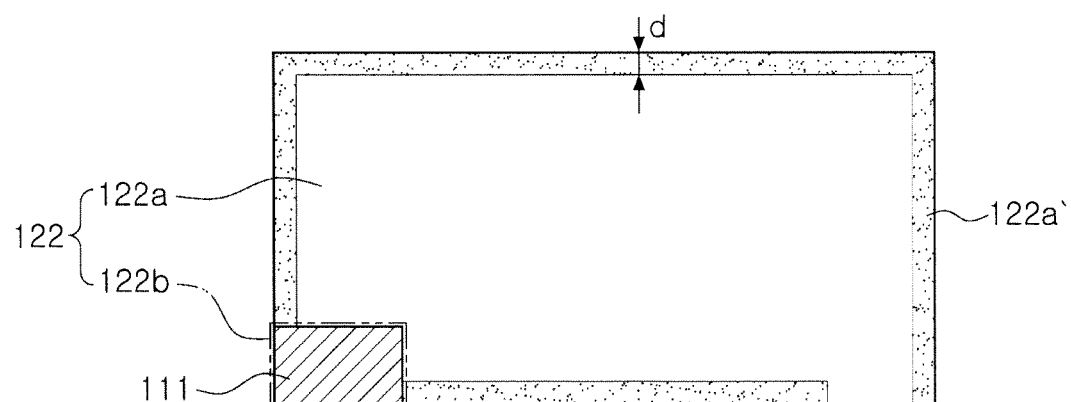

FIGS. 4A and 4B are plan views showing internal electrode structures of the MLCC according to an embodiment of the present invention.

Figure 5A:
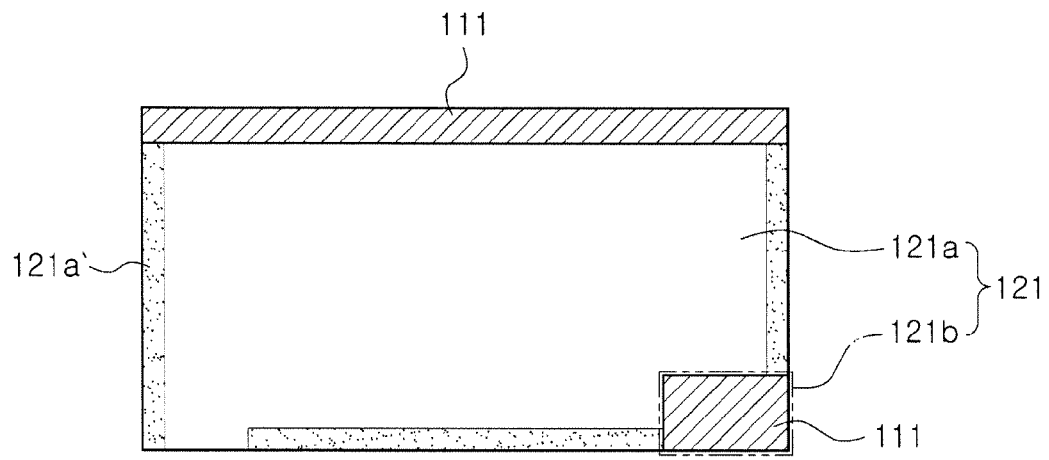
FIGS. 5A and 5B are plan views showing internal electrode structures of the MLCC according to another embodiment of the present invention.
Figure 5B:
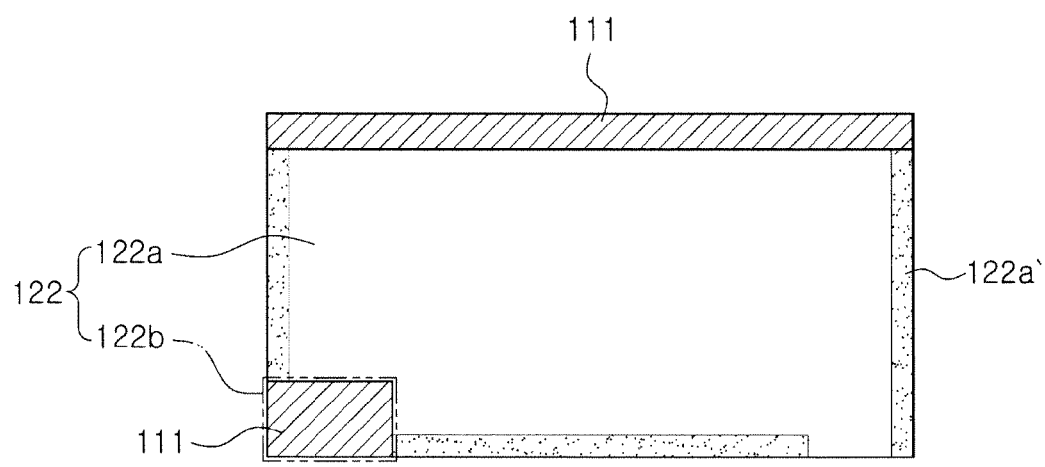

FIGS. 5A and 5B are plan views showing internal electrode structures of the MLCC according to another embodiment of the present invention.

Figure 6A:
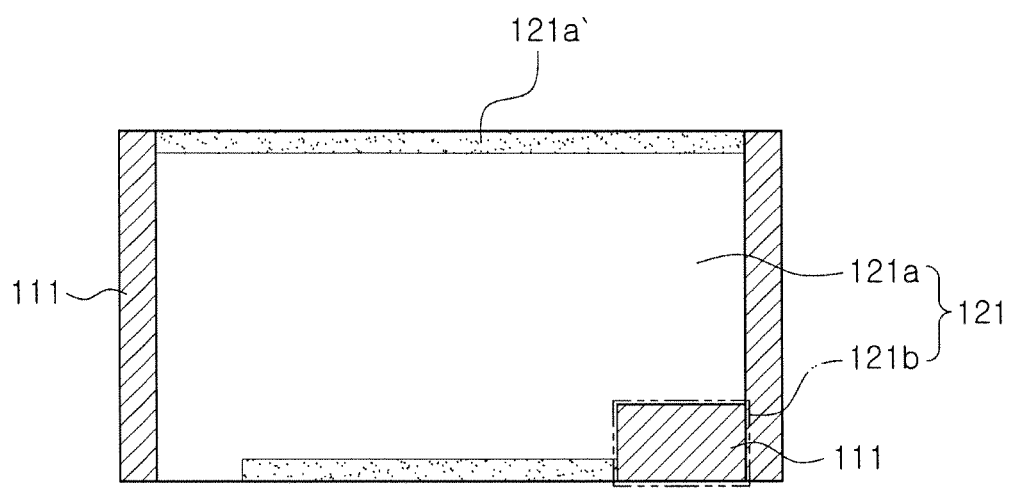
FIGS. 6A and 6B are plan views showing internal electrode structures of the MLCC according to another embodiment of the present invention.
Figure 6B:
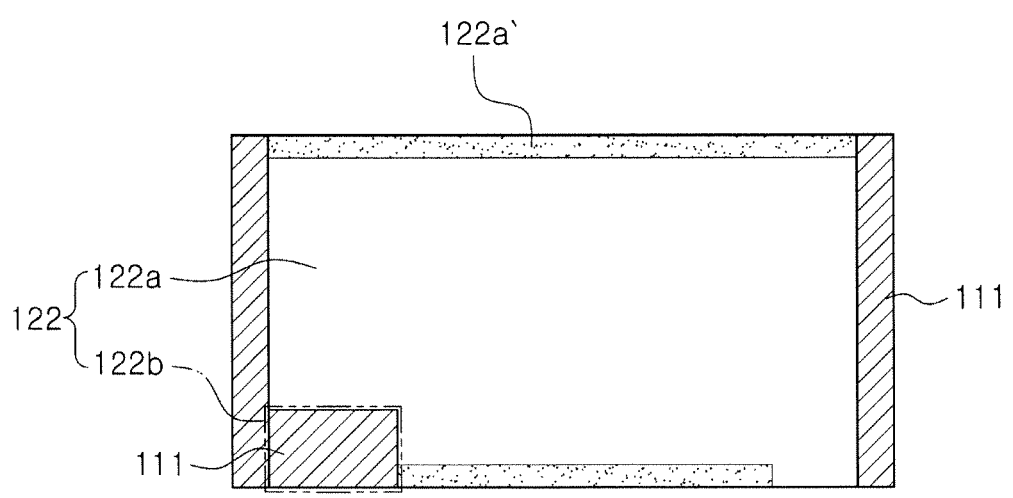

FIGS. 6A and 6B are plan views showing internal electrode structures of the MLCC according to another embodiment of the present invention.

Figure 7:
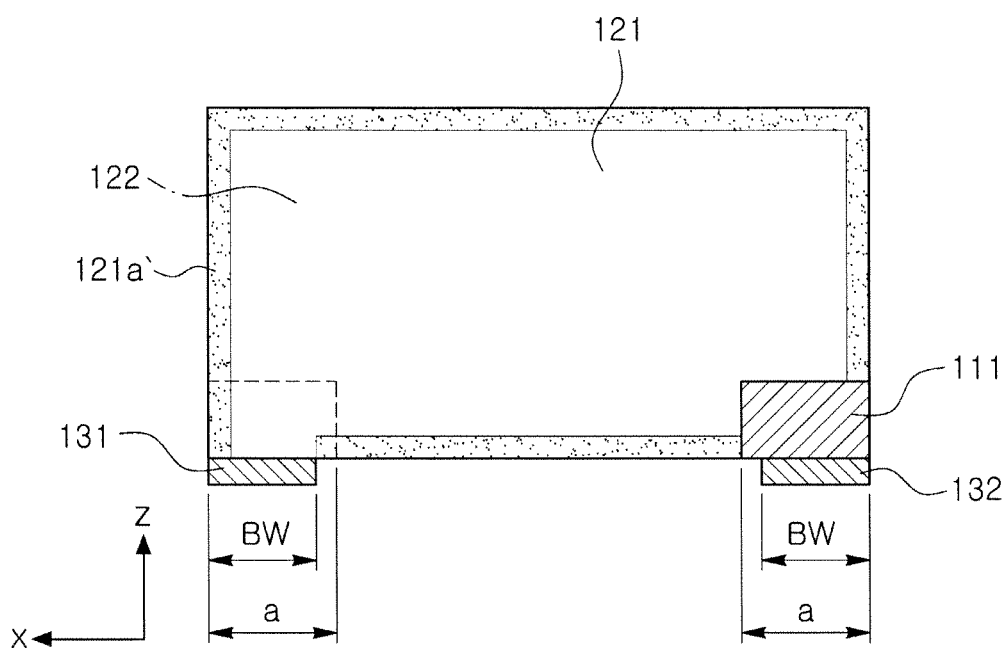
FIG. 7 is an x-z cross-sectional view in FIG. 1.

FIG. 7 is an x-z cross-sectional view in FIG. 1.

Referring to FIG. 1, an MLCC 100 according to the present embodiment may include a ceramic body 110 and first and second external electrodes 131 and 132.

In the present embodiment, the ceramic body 110 may have a first main surface 5 and a second main surface 6 opposing one another and a first lateral surface 1, a second lateral surface 2, a first end surface 3, and a second end surface 4 connecting the first main surface 5 and the second main surface 6. As illustrated, the ceramic body 110 may have a hexahedral shape, but the shape of the ceramic body 110 is not particularly limited. When a chip is fired, the ceramic body 110 may not have a hexahedral shape with perfectly straight lines but may have a substantially hexahedral shape due to sintering shrinkage.

As illustrated in FIG. 2 as a perspective view of the ceramic body 110 and as illustrated in FIG. 3 as an exploded perspective view of the ceramic body 110, the ceramic body 110 may include a plurality of dielectric layers 111 and first and second internal electrodes 121 and 122 formed on the dielectric layers 111 and may be formed by laminating a plurality of dielectric layers with the internal electrodes formed thereon. Also, the first and second internal electrodes may be disposed in a y-axis direction such that they face each other with the dielectric layer 111 interposed therebetween.

According to an embodiment of the present invention, the y-axis direction may be a thickness direction of the ceramic body 110 in which the internal electrodes are laminated with the dielectric layer interposed therebetween, an x-axis direction may be a length direction of the ceramic body, and a z-axis direction may be a width direction of the ceramic body.

The ceramic body 110 may be formed such that the length direction thereof is longer than the width direction or the thickness direction thereof.

According to an embodiment of the present invention, the plurality of dielectric layers 111 constituting the ceramic body 110 are in a sintered state in which adjacent dielectric layers are integrated such that boundaries therebetween may not be readily apparent.

The dielectric layers 111 may be formed by firing ceramic green sheets including ceramic powder, an organic solvent, and an organic binder. The ceramic powder is a material having a high K-dielectric constant (or high permittivity), and as the ceramic powder, for example, a barium titanate (BaTiO$_3$)-based material, a strontium titanate (SrTiO$_3$)-based material, or the like, may be used, but the present invention is not limited thereto.

According to an embodiment of the present invention, the first and second internal electrodes 121 and 122 may be disposed horizontally on the first main surface 5 of the MLCC.

In an embodiment of the present invention, 'first' and 'second' may refer to different polarities.

According to an embodiment of the present invention, the first and second internal electrodes may include a conductive metal. The conductive metal may be nickel (Ni), copper (Cu), palladium (Pd), or an alloy thereof, but the present invention is not limited thereto.

FIGS. 4A and 4B are plan views illustrating the dielectric layer 111 and the first and second internal electrodes 121 and 122 formed on the dielectric layer 111 according to an embodiment of the present invention.

Referring to FIGS. 4A and 4B, the first and second internal electrodes 121 and 122 include pattern portions 121a and 122a and non-pattern portions 121b and 122b, respectively.

The internal electrodes 121 and 122 formed by uniting the pattern portions 121a and 122a and the non-pattern portions 121b and 122b may have a rectangular shape, respectively, and the non-pattern portions 121b and 122b may be formed in one corner portion of the rectangular shape, respectively.

In other words, the pattern portions 121a and 122a refer to regions in which the internal electrode pattern is formed on the dielectric layer, respectively, and in this case, the pattern portions 121a and 122a may be configured such that one corner portion of the rectangular shape is removed, respectively. Namely, the non-pattern portions 121b and 122b refer to regions in which the internal electrode pattern is not formed in the overall rectangular shape of the internal electrodes 121 and 122, respectively, and in this case, a shape of the removed corner portions corresponds to the shape of the non-pattern portions 121b and 122b. The non-pattern portions 121b and 122b may have a rectangular shape smaller than that of the internal electrode.

The first non-pattern portion 121b and the second non-pattern portion 122b may be formed in corner portions opposing one another in the length direction of the internal electrode configuration having a rectangular shape.

In other words, the pattern portions 121a and 122a refer to regions in which an internal electrode pattern is formed on the dielectric layer, respectively, and the non-pattern portions 121b and 122b refer to regions, of quadrangular regions that may be maximally formed by extending the sides formed as end portions of the pattern portions, in which no internal electrode pattern is printed, respectively.

The first internal electrode 121 includes the first pattern portion 121a and the first non-pattern portion 121b, and the second internal electrode 122 includes the second pattern portion 122a and the second non-pattern portion 122b.

Namely, when the first pattern portion and the first non-pattern portion are totaled and when the second pattern portion and the second non-pattern portion are totaled, a quadrangular shape may be formed.

The first non-pattern portion may be formed in a first corner portion of the ceramic body, and the second non-pattern portion may be formed in a second corner portion of the ceramic body.

The term 'corner portion' used in the present disclosure refers to a region in the vicinity of the corner formed as two sides meet. When described based on a cross-section, the corner portion refers to a region in the vicinity of an apex of a quadrangular shape in the x-z section of the ceramic body according to an embodiment of the present invention, and in this case, the corner portion may not necessarily be in contact with a corner in three-dimensions or the apex of a plane and may be construed as referring to an adjacent region.

The second corner portion is formed opposite to the first corner portion in a length direction.

The first and second pattern portions have a mutually overlap region, and end portions thereof may be exposed to one or more of the first and second lateral surfaces and the first and second end surfaces.

Also, the first and second pattern portions include metal oxide regions 121a' and 122a'.

As described hereinafter, the first external electrode 131 is formed such that it is connected to a region of an exposed end portion which is not overlapped with the second pattern portion 122a, of the first pattern portion 121a and the second external electrode 132 may be formed such that it is connected to a region of the exposed end portion which is not overlapped with the first pattern portion 121a, of the second pattern portion 122a.

The first and second pattern portions 121a and 122a may have metal oxide regions 121a' and 122a' formed in the exposed end portion, respectively. The metal oxide regions 121a' and 122a' may have a width from the exposed end portion not connected to the first or second external electrode 131 or 132 toward a central portion of the first and second pattern portions 121a and 122a, respectively.

Namely, the first and second pattern portions 121a and 122a include the metal oxide regions 121a' and 122a' formed in regions, not connected to the external electrodes, of the edges exposed to an outer surface of the ceramic body, respectively.

The metal oxide regions 121a' and 122a', formed by oxidizing metal included in the first and second pattern portions and having insulation properties, may protect the pattern at the inner side of the metal oxide region.

The metal oxide regions 121a' and 122a' may be made of an oxide of nickel (Ni), copper (Cu), palladium (Pd), or an alloy thereof.

As illustrated in FIGS. 4A and 4B, when a width of the metal oxide regions 121a' and 122a' is 'd', 'd' may be 1 μm≤d≤20 μm. If the width (d) of the metal oxide regions 121a' and 122a' exceeds 20 μm, an imbalance may occur due to expansion resulting from oxidization, generating cracks and reducing capacity to less than 95% of initially designed capacity.

Also, if the width (d) of the metal oxide regions 121a' and 122a' is less than 1 μm, portions may not be oxidized to be unable to protect the internal electrodes against the outside, and in addition, even the unoxidized region is plated in a follow-up plating process to generate a short-circuit.

Thus, the width (d) of the metal oxide regions 121a' and 122a' may range from 1 μm to 20 μm.

According to an embodiment of the present invention, as illustrated in FIGS. 4A and 4B, all the first and second lateral surface and the first and second end surfaces of the first and second patterns 121a and 122a may be exposed. In other words, the internal electrodes 121 comprised of the pattern portions 121a and 122a and the non-pattern portions 121b and 122b may have the same area as that of the dielectric layer 111.

As in the present embodiment, when the internal electrodes 121 and 122 have the same area as that of the dielectric layer 111 and the first and second pattern portions 121a and 122a are exposed to all the both lateral surfaces and the both end surfaces of the ceramic body, capacity can be increased. In the related art, internal electrode patterns are formed such that internal electrodes are not exposed to an outer surface of the ceramic body, except for a region connected to an external electrode in order to protect the internal electrodes. Namely, a margin portion is formed to surround the internal electrode pattern on the dielectric layer. However, in an embodiment of the present invention, the internal electrode patterns are formed on the entirety of the dielectric layer 111, except for the non-pattern portions 121b and 122b serving to prevent an electrical connection between the first and second internal electrodes, thus increasing capacity equivalent to rate of the margin portion of the related art. Namely, in the related art, in order to secure connection with an external electrode, only a region in which the first and second internal electrode pattern portions do not overlap is exposed to an outer surface of the ceramic body, but in an embodiment of the present invention, the overlap region of the first and second pattern portions is exposed to an outer surface of the ceramic body, implementing maximum capacity.

However, when the internal electrodes are exposed to the outside, the pattern portions may be damaged by corrosion or a short-circuit may occur during a plating process; however, in an embodiment of the present invention, the metal oxide regions 121a' and 122a' are formed to have a predetermined width from the exposed end portion to thus protect the internal electrodes against the outside.

According to a different embodiment, as illustrated in FIGS. 5A and 5B, the first and second pattern portions 121a and 122a may be exposed to the first and second end surfaces and the first lateral surface but not to the second lateral surface. Also, in the present embodiment, capacity may be increased by an area rate of the extending pattern portions in comparison to the related art in which margin portions are included in both end surfaces and both lateral surfaces.

Also, as illustrated in FIGS. 6A and 6B, the first and second pattern portions 121a and 122a may be exposed to the first and second lateral surfaces but not to the first and second end surfaces. In this case, the internal electrodes are not formed to regions adjacent to the first and second end surfaces of the dielectric layer 111, but capacity may be increased by an area rate of the pattern portions 121a and 122a extending to be exposed to the first and second lateral surfaces. According to an embodiment of the present invention, the first external electrode 131 may be connected to the first internal electrode 121 and the second external electrode 132 may be connected to the second internal electrode 122.

In detail, the first external electrode 131 may be connected to a region which is not overlapped with the second pattern portion 122a, of the first pattern portion 121a, and the second external electrode 132 may be connected to a region which is not overlapped with the first pattern portion 121a, of the second pattern portion 122a.

The first external electrode 131 may be connected to a portion of the first pattern portion 121a such that it is not in contact with the second pattern portion 122a, and the second external electrode 132 may be connected to a second lead out portion such that it is not in contact with the first pattern portion 121a.

According to an embodiment of the present invention, the first and second pattern portions may have a mutually overlapped end portion which is exposed, and may be connected to the first and second external electrodes having mutually different polarities.

The first and second external electrodes 131 and 132 may include a conductive metal, and the conductive metal may be nickel (Ni), copper (Cu), tin (Sn), or an alloy thereof, but the present invention is not limited thereto.

As illustrated in FIG. 1, the first and second eternal electrodes 131 and 132 may be formed on the first lateral surface, and when the first and second eternal electrodes 131 and 132 are formed on the same surface of the MLCC, a mounting area may be reduced to enhance a mounting density of a circuit board.

In addition, according to an embodiment of the present invention, the structure of the external electrodes may be variously modified, and the external electrodes may extend from the first lateral surface to at least one of the first and second main surfaces and the second lateral surface.

In detail, the first and second external electrodes 131 and 132 may extend from the first lateral surface to the first main surface, may extend to the first and second main surfaces, or may extend to one of the first and second main surfaces and the second lateral surface.

In addition, the first and second external electrodes 131 and 132 may extend from the first lateral surface to the second main surface and the second lateral surface and, in this case, the first and second external electrodes 131 and 132 may form a '□' (a quadrangular shape).

Also, the first and second external electrodes 131 and 132 may extend from the first lateral surface to predetermined heights (or predetermined portions) of the first and second main surfaces or may extend from the first lateral surface to predetermined heights (or predetermined portions) of the first and second end surfaces.

When the first and second external electrodes 131 and 132 extend in the foregoing manners according to an embodiment of the present invention, a contact area of the MLCC with solders may be increased when the MLCC is mounted on a circuit board, securing landing stability to enhance sticking strength of the MLCC.

FIG. 7 is a cross-sectional view of x-z plane in FIG. 1.

Referring to FIG. 7, when a width of a region of the first and second external electrodes 131 and 132 in contact with the first or second non-pattern portion 121b or 122b is BW and a length of the first or second non-pattern portion is 'a', BW<a may be satisfied.

If BW is equal to or greater than 'a', the first and second internal electrodes 121 and 122 may be electrically connected.

Also, although not shown, the external electrodes 131 and 132 may not necessarily be in contact with the corner of the ceramic body 110, and may be formed to be spaced apart from the corner of the ceramic body 110 by a predetermined interval.

According to an embodiment of the present invention, since the exposed end portions of the first and second internal electrodes have an overlap region, a capacity of the MLCC can be increased. Also, since the first and second external electrodes are formed on the same surface of the ceramic body so the distance between the first and second internal electrodes to which external polarities are applied is reduced, a current loop can be shortened, and thus, equivalent series inductance (ESL) can be lowered.

In addition, according to an embodiment of the present invention, since the internal electrodes are protected by the metal oxide region without any additional element for protecting the interior of the internal electrodes, a size of the MLCC can be reduced.

First Method of Manufacturing MLCC

A method of manufacturing an MLCC according to another embodiment of the present invention includes: preparing a plurality of first and second ceramic green sheets; forming a first internal electrode 121 on the first ceramic green sheet, the first internal electrode 121 including a first pattern portion 121a and a first non-pattern portion 121b and the first pattern portion 121a being exposed to an end surface of the first ceramic green sheet; forming a second internal electrode 122 on the second ceramic green sheet, the second internal electrode 122 including a second non-pattern portion 122b and a second pattern portion 122a having an overlap region with the first pattern portion 121a and the second pattern portion 122a being exposed to an end surface of the second ceramic green sheet; alternately laminating the first and second ceramic green sheets and firing the same to fabricate a ceramic body 110 in which end portions of the first and second pattern portions 121a and 122b are exposed to one or more of the first and second lateral surfaces and the first and second end surfaces; applying a resin to an outer surface of the ceramic body on which external electrodes are to be formed, to seal exposed end portions of the first and second pattern portions 121a and 122a to be connected to the external electrodes; oxidizing an unsealed region of the end portions of the first and second pattern portions 121a and 122a exposed to the outer surface of the ceramic body 110 to form metal oxide regions 121a' and 122a'; and removing the resin and subsequently forming first and second external electrodes 131 and 132 electrically connected to the first and second internal electrodes 121 and 122, respectively.

A repeated description regarding a configuration of the foregoing MLCC will be omitted and, hereinafter, a method of manufacturing an MLCC will be described in detail.

The forming of the first and second internal electrodes 121 and 122 may be performed by printing internal electrodes with a conductive paste on a ceramic green sheet constituting a dielectric layer through a printing method such as a screen printing method or a gravure printing method, but the present invention is not limited thereto.

Next, a plurality of first and second ceramic green sheets with the first and second internal electrodes formed thereon may be alternately laminated and pressed in a lamination direction to compress the laminated first and second ceramic sheets and the first and second internal electrodes. The compressed first and second ceramic sheets and the first and second internal electrodes are subsequently fired.

In this manner, a laminate in which the plurality of dielectric layers 111 and the plurality of first and second internal electrodes 121 and 122 are alternately laminated is configured.

Thereafter, the laminate is cut in every region corresponding to each MLCC to form chips, and the severed chips are calcined, fired, and grinded to complete the ceramic body 110 having the first and second internal electrodes 121 and 122.

The first and second pattern portions 121a and 122a of the first and second internal electrodes 121 and 122 have a mutually overlap region, and end portions of the first and second pattern portions 121a and 122a are exposed to at least one surface of the ceramic body 110. In addition, the exposed end portions of the first and second pattern portions 121a and 122a have a mutually overlap region.

Thereafter, a resin is applied to positions, in which external electrodes are to be formed, of an outer surface of the ceramic body 110, to seal portions of the exposed end portions of the pattern portions, and thereafter, unsealed exposed end portions of the first and second pattern portions 121a and 122a are subsequently oxidized to form the metal oxide regions 121a' and 122a'. The resin is not particularly limited and an epoxy resin may be used.

This is because, if the positions, in which the external electrodes are to be formed, are not sealed in advance so as to be protected, the exposed end portions of the pattern portions may be entirely oxidized to result in failure of securing electrical connection with external electrodes.

The metal oxide regions 121a' and 122a' may have a thickness ranging from 1 μm to 20 μm.

After the formation of the metal oxide regions 121a' and 122a', the resin applied for sealing is removed, and the first and second external electrodes 131 and 132 are formed to be electrically connected to the first and second pattern portions, respectively, thus obtaining the MLCC according to an embodiment of the present invention.

The first and second external electrodes 131 and 132 may be formed with a conductive paste including a conductive metal.

The conductive metal may be a nickel (Ni), copper (Cu), tin (Sn), or an alloy thereof, but the present invention is not limited thereto. The conductive paste may further include an insulating material and, in this case, the insulating material may be, for example, glass, an organic resin, or the like, but the present invention is not limited thereto.

A method for forming the first and second external electrodes 131 and 132 is not particularly limited. The first and second external electrodes 131 and 132 may be formed by dipping the ceramic body 110, and any other various methods, such as plating, printing, and the like, may also be used.

Second Method of Manufacturing MLCC

A method of manufacturing an MLCC according to another embodiment of the present invention includes: preparing a plurality of first and second ceramic green sheets; forming a first internal electrode 121 on the first ceramic green sheet, the first internal electrode 121 including a first pattern portion 121a and a first non-pattern portion 121b and the first pattern portion 121a being exposed to an end surface of the first ceramic green sheet; forming a second internal electrode 122 on the second ceramic green sheet, the second internal electrode 122 including a second non-pattern portion 122b and a second pattern portion 122a having an overlap region with the first pattern portion 121a and the second pattern portion 122a being exposed to an end surface of the second ceramic green sheet; alternately laminating the first and second ceramic green sheets and firing the same to fabricate a ceramic body 110 in which end portions of the first and second pattern portions 121a and 122b are exposed to one or more of the first and second lateral surfaces and the first and second end surfaces; forming first and second external electrodes 131 and 132 electrically connected to the first and second internal electrodes 121 and 122, respectively; and oxidizing regions, which are not connected to the external electrodes, of the end portions of the first and second pattern portions 121a and 122a exposed to the outer surface of the ceramic body 110, to form metal oxide regions 121a' and 122a', wherein the first and second external electrodes 131 and 132 are made of a conductive resin composition.

The ceramic body 110 having the first and second internal electrodes is prepared through the same method as the foregoing method of fabricating the ceramic body.

In the present embodiment, instead of applying a resin to the external electrode formation positions, the first and second external electrodes 131 and 132 are formed with a conductive resin composition so as to be electrically connected to the first and second pattern portions 121a and 122a, and regions, which are not connected to the first or second external electrode, of the end portions of the first and second pattern portions 121a and 122a exposed to an outer surface of the ceramic body 110 are oxidized to form the metal oxide regions 121a' and 122a'.

In the present embodiment, the oxidizing to form the metal oxide regions may be performed under an air atmosphere, and the conductive resin composition used to form the first and second external electrodes 131 and 132 includes a base resin and metal powder not oxidized under an air atmosphere.

If the metal powder included in the conductive resin composition used to form the first and second external electrodes 131 and 132 is metal oxidized under an air atmosphere, even the metal powder exposed to the surfaces of the first and second external electrodes 131 and 132 may be oxidized when the metal oxide regions 121a' and 122a' are formed, resulting in failure to secure an electrical connection with the exterior. Namely, even the external electrodes are oxidized to lose functionality.

Thus, in the case of forming external electrodes by using a conductive resin composition as in the present embodiment, rather than sealing with a resin, the conductive resin composition should necessarily include metal powder not oxidized under an air atmosphere, and the metal powder may include silver (Ag) but the present invention is not limited thereto. In addition, a metal powder such as silver (Ag) not oxidized under an air atmosphere may be coated on a surface of a metal oxidized under an air atmosphere. In this case, since the surface of the metal powder is not oxidized under an air atmosphere, the metal, which is within the metal powder and oxidized under an air atmosphere, may be protected.

The base resin may include an epoxy resin, but the present invention is not limited thereto.

A method for forming the first and second external electrodes 131 and 132 is not particularly limited. The first and second external electrodes 131 and 132 may be formed by dipping the ceramic body 110, and any other various methods, such as plating, printing, and the like, may also be used.

Circuit Board with MLCC Mounted Thereon

Figure 8:
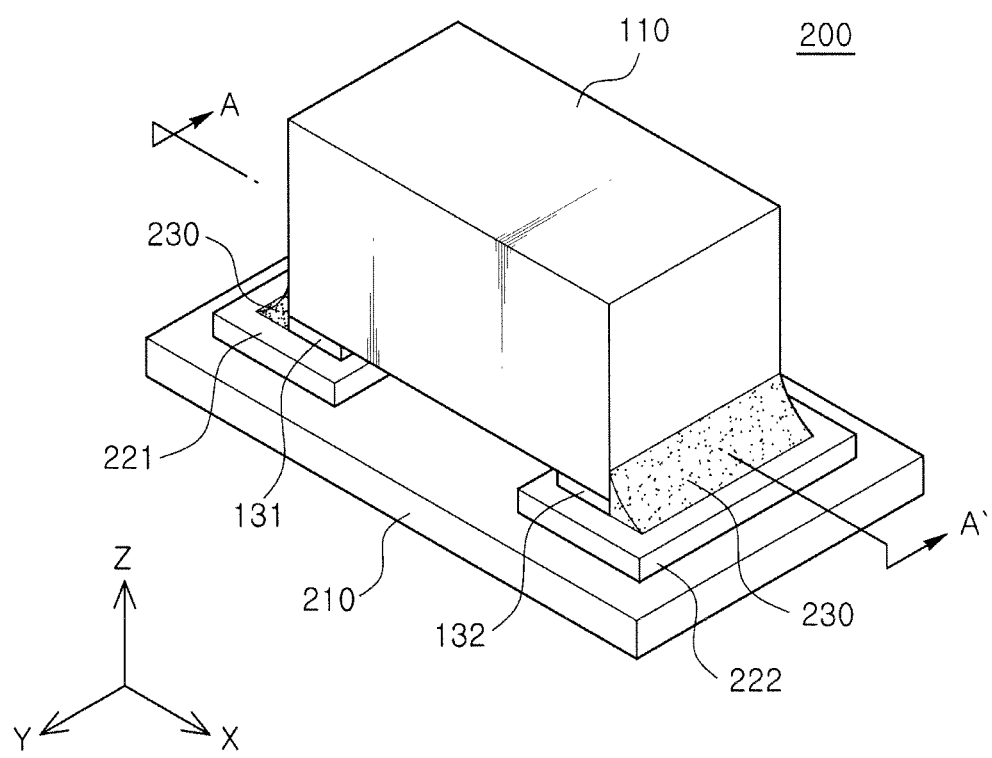
FIG. 8 is a view illustrating a circuit board with an MLCC mounted thereon according to an embodiment of the present invention.
Figure 9:
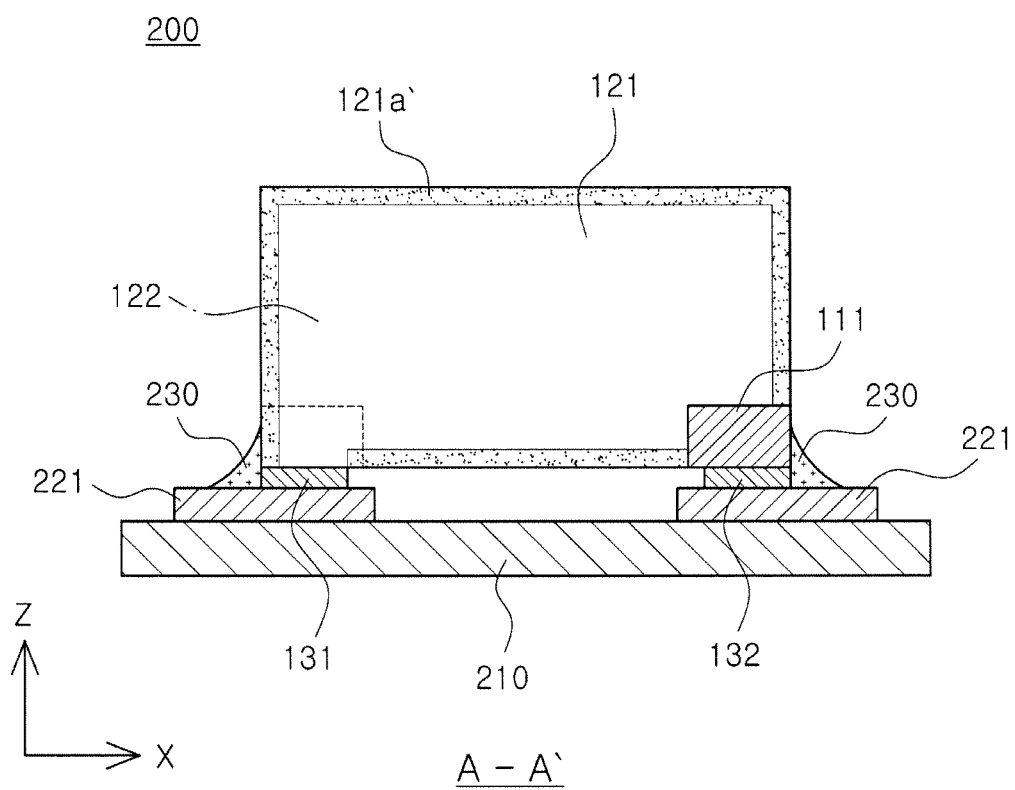
FIG. 9 is a cross-sectional view taken along line A-A' in FIG. 8.

FIG. 8 is a view illustrating a circuit board with an MLCC mounted thereon according to an embodiment of the present invention, and FIG. 9 is a cross-sectional view taken along line A-A' in FIG. 8.

Referring to FIGS. 8 and 9, a circuit board 200 with a multilayer ceramic capacitor (MLCC) according to the present embodiment mounted thereon may include a printed circuit board (PCB) 210, first and second electrode pads 221 and 222 formed to be spaced apart from one another on an upper surface of the PCB 210, and the MLCC 100 mounted on the PCB 210 and disposed to be in contact with the first and second electrode pads 221 and 222.

Here, the MLCC 100 may be electrically connected to the PCB 210 by solders 230 in a state in which the first and second external electrodes 131 and 132 thereof are positioned to be in contact with the first and second electrode pads 221 and 222.

The MLCC mounted on the circuit board has the same configuration as that described above, so a detailed description thereof will be omitted to avoid repetition.

According to an embodiment of the present invention, when the MLCC having the external electrodes formed on the same surface thereof is mounted on the circuit board, a contact area between the first and second electrode pads and the first and second external electrodes is increased, enhancing a mounting density and sticking force.

Experimental Example

Table 1 below shows a crack rate based on a width of a metal oxide region, a short-circuit rate in a plating process, and a capacity over design.

The MLCC according to an experimental example was manufactured through the second manufacturing method as described above, and approximately 250 ceramic green sheet of about 1.10 um were laminated and fired to form the MLCC having a size of approximately 0.6 mm×0.3 mm×0.3 mm (length (L)×width (W)×thickness (T)).

Here, a manufacturing tolerance was determined to be ±0.05 mm in length (L)×width (W)×thickness (T). MLCCs satisfying the manufacturing tolerance were tested to measure a crack rate, a short-circuit rate in a plating process, and a capacity over design.

TABLE 1

| Width of metal oxide region (μm) | Crack rate (%) | Short-circuit rate in plating process (%) | Capacity over design (%) |
| --- | --- | --- | --- |
| 0.7* | 0 | 5 | 100 |
| 1 | 0 | 0 | 100 |
| 1.5 | 0 | 0 | 100 |
| 2 | 0 | 0 | 100 |
| 5 | 0 | 0 | 100 |
| 10 | 0 | 0 | 100 |
| 15 | 0 | 0 | 100 |
| 18 | 0 | 0 | 100 |
| 20 | 0 | 0 | 100 |
| 22* | 3 | 0 | 98 |
| 25* | 5 | 0 | 95 |
| 30* | 10 | 0 | 90 |

*indicates comparative example

As illustrated in Table 1 above, when the width of the metal oxide region exceeds 20 μm, a crack rate due to expansion of oxidization is increased and the pattern portion is excessively oxidized to degrade capacity. Also, in order to avoid short-circuit occurrence during a plating process, the width of the metal oxide region is required to be equal to or greater than 1 μm.

Thus, as mentioned above, preferably, the metal oxide region has a width ranging from 1 μm to 20 μm.

As set forth above, according to embodiments of the invention, since an overlap region of the first and second internal electrodes forming a capacitance formation part is increased, the capacity of the MLCC can be increased.

Also, since the exposed internal electrode pattern portions are oxidized, an additional element for protecting the internal electrodes is not required, reducing the size of the MLCC.

In addition, in the case of the MLCC according to an embodiment of the present invention, since the external electrodes are formed on the same surface of the MLCC, a mounting density can be enhanced.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
 a ceramic body including a dielectric layer and having first and second main surfaces opposing one another, first and second lateral surfaces opposing one another, and first and second end surfaces opposing one another;
 a first internal electrode having a first non-pattern portion and a first pattern portion exposed to the first and second lateral surfaces and the first and second end surfaces;
 a second internal electrode having an overlap region with the first pattern portion with the dielectric layer interposed therebetween and having a second non-pattern portion and a second pattern portion exposed to the first and second lateral surfaces and the first and second end surfaces; and
 first and second external electrodes electrically connected to the first and second internal electrodes, respectively,
 wherein the first and second pattern portions have a metal oxide region having a predetermined width from an exposed end portion of a region thereof not connected to the first or the second external electrode, among exposed end portions, toward a central portion thereof, respectively,
 in the length-width section of the ceramic body, the first non-pattern portion is formed in a first corner portion of the ceramic body, and the second non-pattern portion is formed in a second corner portion of the ceramic body, opposing the first corner portion in a length direction of the ceramic body and on a same side as the first corner portion in a width direction of the ceramic body, and
 when a width of the metal oxide region is d, d satisfies 1 μm≤d≤20 μm.

2. The multilayer ceramic capacitor of claim 1, wherein the metal oxide region is formed by oxidizing metal included in the first and second internal electrodes.

3. The multilayer ceramic capacitor of claim 1, wherein the first and second external electrodes are formed on the first lateral surface.

4. The multilayer ceramic capacitor of claim 3, wherein the first and second external electrodes extend from the first lateral surface to the first main surface.

5. The multilayer ceramic capacitor of claim 3, wherein the first and second external electrodes extend from the first lateral surface to the first and second main surfaces.

6. The multilayer ceramic capacitor of claim 3, wherein the first and second external electrodes extend from the first lateral surface to any one of the first and second main surfaces and the second lateral surface.

7. The multilayer ceramic capacitor of claim 3, wherein the first and second external electrodes extend from the first lateral surface to the first and second main surfaces and the second lateral surface.

8. The multilayer ceramic capacitor of claim 3, wherein the first and second external electrodes extend from the first lateral surface to a predetermined height on the first and second main surfaces.

9. The multilayer ceramic capacitor of claim 1, wherein the first and second external electrodes have a band-like shape, and when a width of a region of the first and second external electrodes in contact with the first or second non-pattern portion is BW and a length of the first or second non-pattern portion is 'a', BW<a is satisfied.

10. A circuit board comprising:
a printed circuit board having first and second electrode pads formed on an upper portion thereof; and
a multilayer ceramic capacitor mounted on the printed circuit board,
wherein the multilayer ceramic capacitor comprises:
a ceramic body having first and second main surfaces opposing one another, first and second lateral surfaces opposing one another, and first and second end surfaces opposing one another; a first internal electrode having a first pattern portion exposed to the first and second lateral surfaces and the first and second end surfaces and a first non-pattern portion formed in a first corner portion of the ceramic body; a second internal electrode having a region overlapped with the first pattern portion with the dielectric layer interposed therebetween, the overlap region having a second pattern portion exposed to the first and second lateral surfaces and the first and second end surfaces and a second non-pattern portion formed in a second corner portion; and first and second external electrodes connected to the first and second internal electrodes, respectively, wherein the first and second pattern portions have a metal oxide region having a predetermined width from an exposed end portion of a region thereof not connected to the first or the second external electrode, among exposed regions, toward a central portion thereof, respectively,
in the length-width section of the ceramic body, the first non-pattern portion is formed in the first corner portion of the ceramic body, and the second non-pattern portion is formed in the second corner portion of the ceramic body, opposing the first corner portion in a length direction of the ceramic body and on a same side as the first corner portion in a width direction of the ceramic body, and
when a width of the metal oxide region is d, d satisfies $1\ \mu m \leq d \leq 20\ \mu m$.

* * * * *